(12) United States Patent
Zhang et al.

(10) Patent No.: US 8,436,303 B2
(45) Date of Patent: May 7, 2013

(54) TRANSMISSION ELECTRON MICROSCOPE MICRO-GRID

(75) Inventors: Li-Na Zhang, Beijing (CN); Chen Feng, Beijing (CN); Kai-Li Jiang, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/609,832

(22) Filed: Sep. 11, 2012

(65) Prior Publication Data

US 2013/0009073 A1    Jan. 10, 2013

Related U.S. Application Data

(60) Division of application No. 12/750,210, filed on Mar. 30, 2010, now Pat. No. 8,294,098, which is a continuation-in-part of application No. 12/005,741, filed on Dec. 28, 2007, now Pat. No. 8,288,723.

(51) Int. Cl.
*H01J 37/26* (2006.01)
(52) U.S. Cl.
USPC ........... 250/311; 250/306; 250/307; 250/310; 250/492.1; 250/492.3; 438/409; 438/960

(58) Field of Classification Search .................. 250/306, 250/307, 310, 492.1, 492.3, 311; 438/409, 438/960
See application file for complete search history.

(56) References Cited

U.S. PATENT DOCUMENTS

| | | | |
|---|---|---|---|
| 4,163,900 A | 8/1979 | Warren et al. | |
| 4,250,127 A | 2/1981 | Warren et al. | |
| 7,745,302 B2 * | 6/2010 | Zhang et al. | 438/409 |
| 8,288,723 B2 * | 10/2012 | Zhang et al. | 250/311 |
| 8,294,098 B2 * | 10/2012 | Zhang et al. | 250/311 |
| 2006/0169975 A1 * | 8/2006 | Noy et al. | 257/40 |

FOREIGN PATENT DOCUMENTS

| | | |
|---|---|---|
| CN | 1206697 | 6/2005 |
| TW | 200830348 | 7/2008 |
| TW | 200842105 | 11/2008 |

* cited by examiner

*Primary Examiner* — Michael Logie
(74) *Attorney, Agent, or Firm* — Altis Law Group, Inc.

(57) ABSTRACT

A transmission electron microscope (TEM) micro-grid includes a grid and a heater including at least one carbon nanotube film structure located on the grid. The micro-grid with the at least one carbon nanotube film structure prevents a floating of the sample located on the micro-grid to increase the quality of TEM images.

16 Claims, 14 Drawing Sheets

TRANSMISSION ELECTRON MICROSCOPE MICRO-GRID

CROSS-REFERENCE TO RELATED APPLICATIONS

This application is a division of U.S. patent application Ser. No. 12/750,210, filed on Mar. 30, 2010, entitled, "TRANSMISSION ELECTRON MICROSCOPE MICRO-GRID" which claims all benefits accruing under 35 U.S.C. §119 from China Patent Application No. 200910189914.6, filed on Aug. 28, 2009 in the China Intellectual Property Office, disclosure of which is incorporated herein by reference. The U.S. patent application Ser. No. 12/750,210 is a continuation-in-part of U.S. patent application Ser. No. 12/005,741, filed Dec. 28, 2007, entitled, "TRANSMISSION ELECTRON MICROSCOPE (TEM) MICRO-GRID AND METHOD FOR MAKING THE SAME."

BACKGROUND

1. Technical Field

The present disclosure relates to transmission electron microscope (TEM) micro-grids; especially to a TEM micro-grid which is capable of heating a sample.

2. Description of Related Art

In a typical/conventional transmission electron microscope (TEM), a TEM micro-grid is used to carry a sample and to observe high-resolution transmission electron microscope (HRTEM) images. In order to observe state changes of a sample at different temperatures with a TEM, a stove is usually employed to heat the sample. The stove has a heating space defined therein for receiving the TEM micro-grid with a sample on it.

However, in actual applications, the sample is prone to float relative to the TEM micro-grid during heating, thereby decreasing quality of the TEM images.

What is needed therefore, is a TEM micro-grid, which can prevent a sample from floating during heating.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
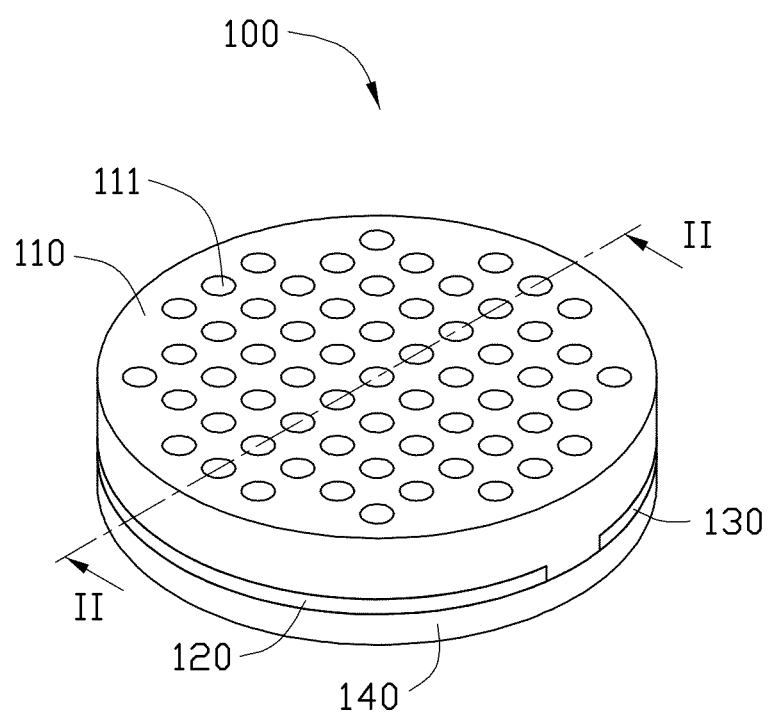
FIG. 1 is a schematic structural view of an embodiment of a transmission electron microscope (TEM) micro-grid.
Figure 2:
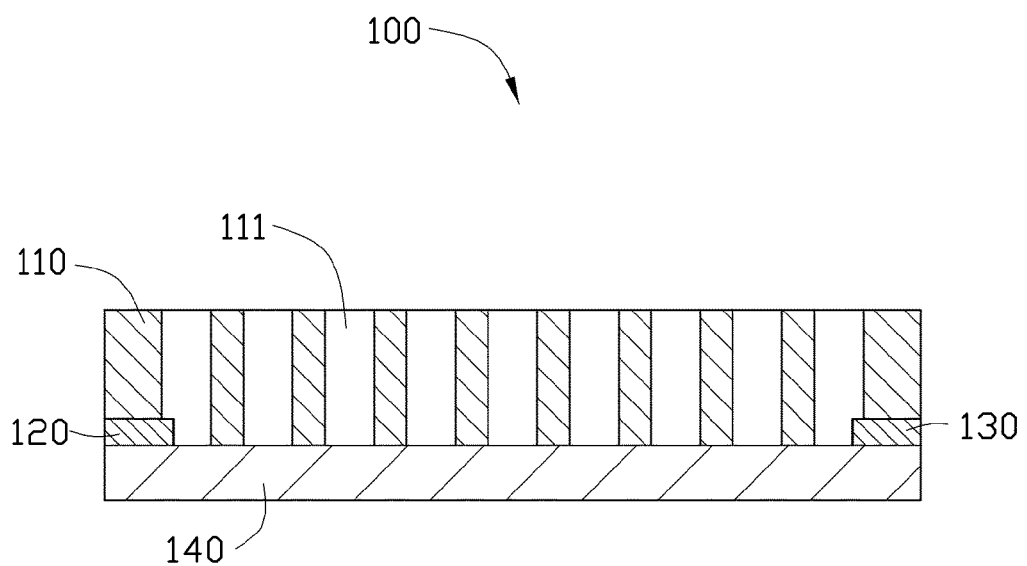
FIG. 2 is a cross-sectional view of the TEM micro-grid along a line II-II in FIG. 1.

Referring to FIG. 1 and FIG. 2, a transmission electron microscope (TEM) micro-grid 100 includes a grid 110, a first electrode 120, a second electrode 130, and a carbon nanotube film structure 140. The carbon nanotube film structure 140 is disposed on the grid 110. The first electrode 120 and the second electrode 130 are electrically connected to the carbon nanotube film structure 140.

Figure 3:
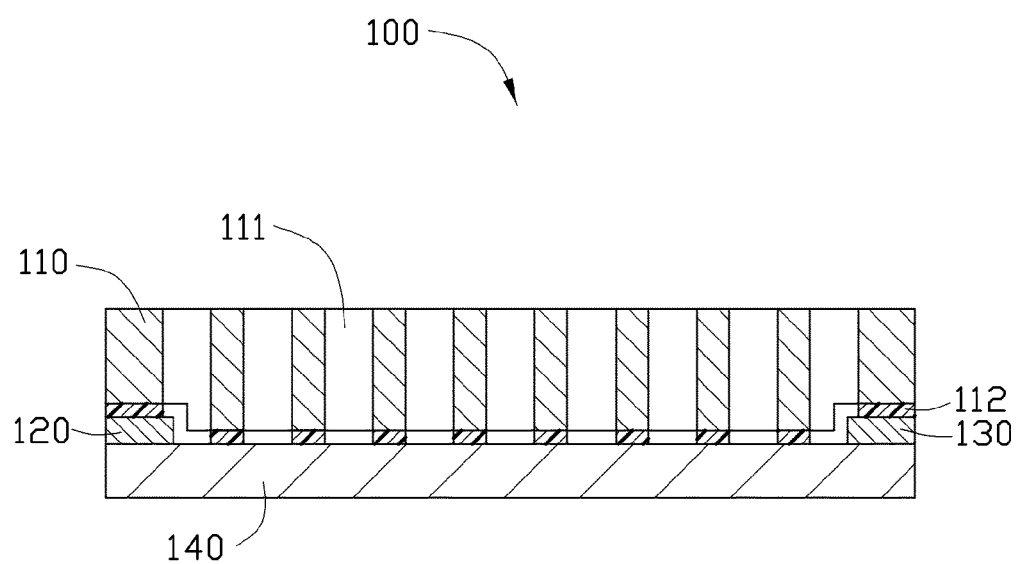
FIG. 3 is a cross-sectional view of an embodiment of a TEM micro-grid.

The grid 110 can be a supporting element having a contacting surface, the carbon nanotube film structure 140 can be loaded on the contacting surface. In one embodiment, the grid 110 is a porous structure having a plurality of substantially uniform micropores 111. Each of the micropores 111 can have a dimension of about 80 micrometers to about 100 micrometers. The carbon nanotube film structure 140 covers at least one of the micropores 111, thus at least part of the carbon nanotube film structure 140 can be suspended. The grid 110 can include one or more micropores 111 for suspending the carbon nanotube film structure 140. The at least one micropore 111 can have a dimension of about 1 micrometer to about 3 millimeters. The shape of the grid 110 is not limited. A cross-section of the grid 110 can be round, square, elliptical or other shape. In order to cooperate with a common transmission electron microscope TEM, the cross-section of the grid 110 usually is round with a diameter of about 3 millimeters. A material of the grid 110 can be electrically and thermally insulating material, whereby the grid 110 and the carbon nanotube film structure 140 can be kept electrically and thermally isolated. Referring to FIG. 3, in one embodiment, an insulation layer 112 can also be located between the grid 110 and the carbon nanotube film structure 140 to insulate the grid 110 from the carbon nanotube film structure 140. The material of the grid 110 is not limited. The insulation layer 112 can be formed by coating the insulating heat-resistant material onto the contacting surface of the grid 110. A thermal expansion coefficient of the insulating heat-resistant material can be close to a thermal expansion coefficient of the carbon nanotube film structure 140. Generally, an absolute value of the thermal expansion coefficient of the insulating heat-resistant material can be less than 3, whereby less deformation can occur as temperature thereof changes. The insulating heat-resistant material can be silicon, silicon dioxide, silicon nitride, quartz, glass, ceramic, or combinations thereof. In one embodiment, the insulating heat-resistant material is ceramic, and the thermal expansion coefficient of the ceramic ranges from about 0 to about 0.1.

Figure 4:
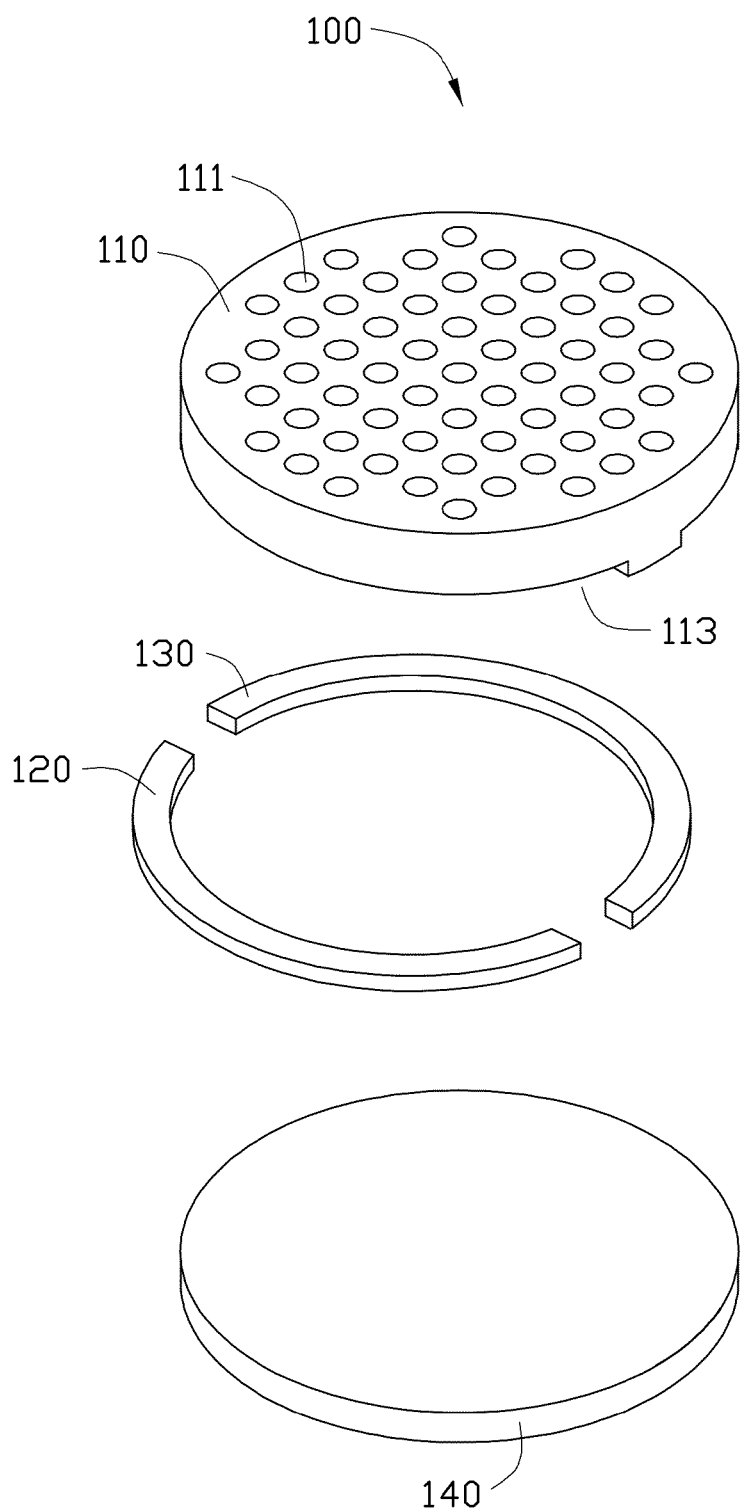
FIG. 4 is an exposed view of the TEM micro-grid shown in FIG. 1.
Figure 5:
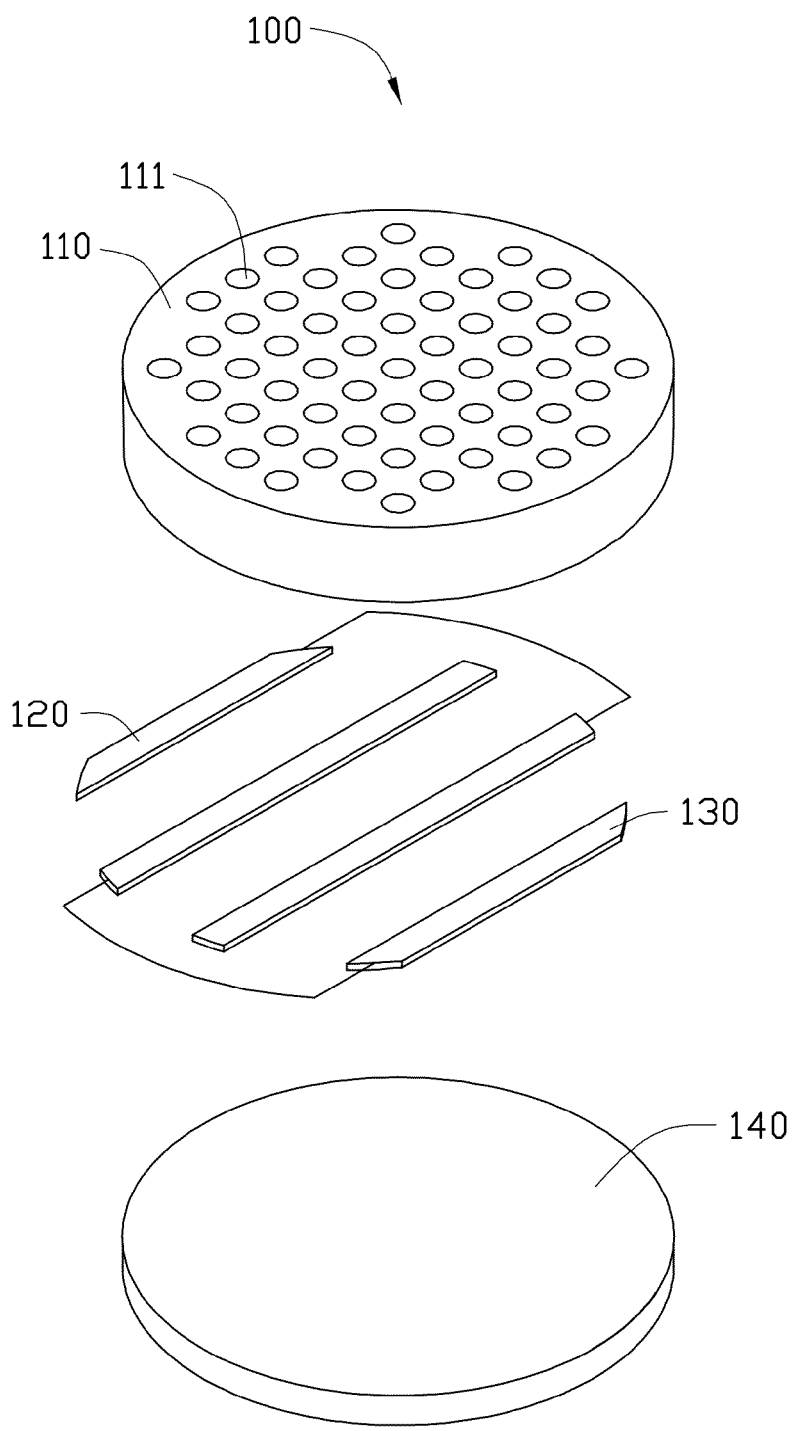
FIG. 5 is an exposed view of an embodiment of a TEM micro-grid with more than one first electrode and more than one second electrode.
Figure 6:
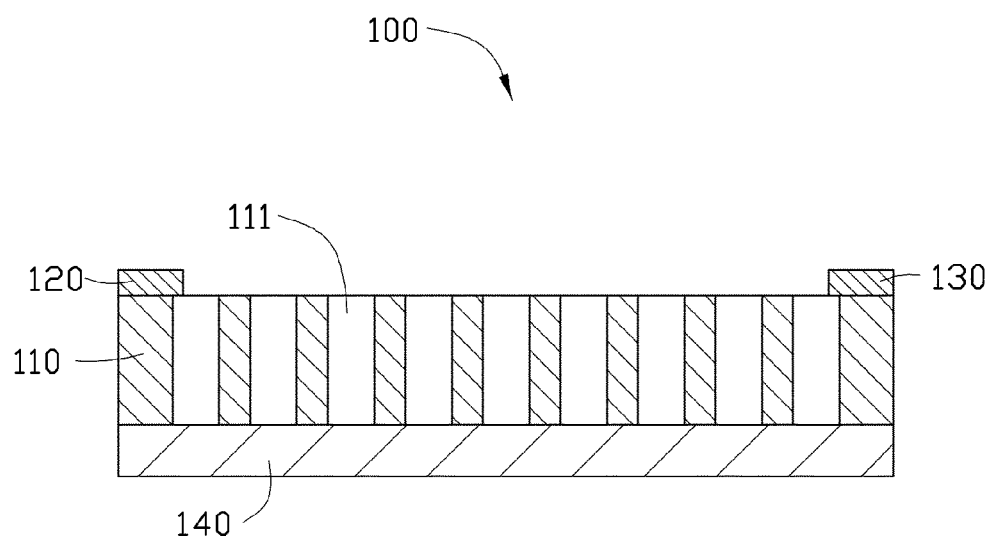
FIG. 6 is a cross-sectional view of an embodiment of a TEM micro-grid.
Figure 7:
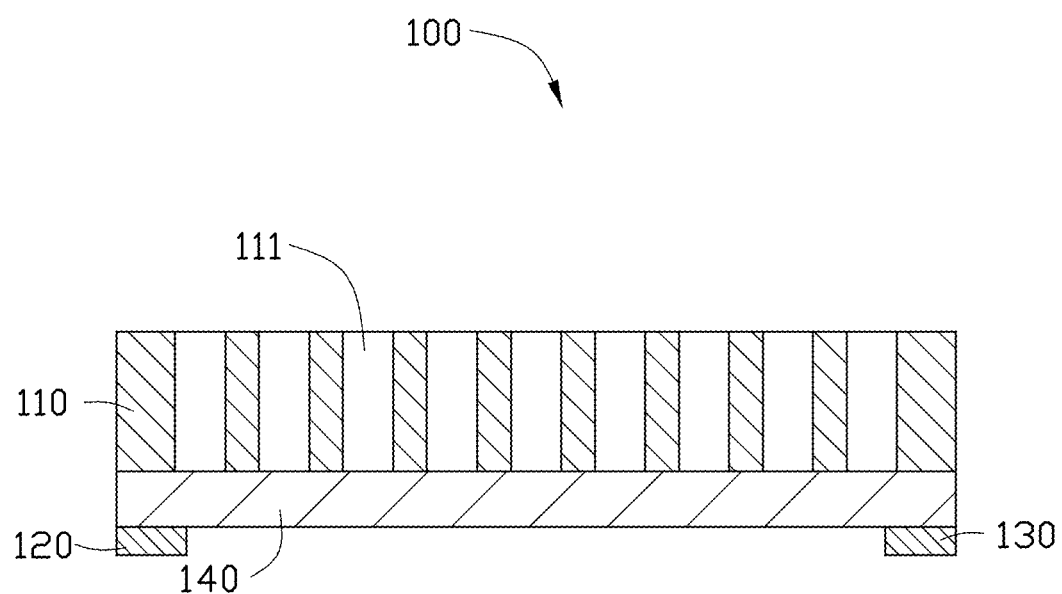
FIG. 7 is a cross-sectional view of an embodiment of a TEM micro-grid.

In one embodiment, the first and second electrodes 120, 130 are sandwiched between the grid 110 and the carbon nanotube film structure 140 and located on two opposite ends of the carbon nanotube film structure 140. The first and second electrodes 120, 130 can be arc shaped as shown in FIG. 4. The first and second electrodes 120, 130 can surround the carbon nanotube film structure 140, thus the TEM micro-grid 100 can obtain a larger heating area, because more of the carbon nanotubes can be electrically connected to the first and second electrodes 120, 130. Means for forming the first and second electrodes 120, 130 on the contacting surface can be screen printing conductive slurry on the contacting surface. The two electrode rods or threads can be adhered to the contacting surface directly, or embedded into the contacting surface. In one embodiment, the first and second electrodes 120, 130 are embedded in the grid 110 as shown in FIG. 2. Alternatively, the grid 110 can have two grooves 113 corresponding to the first and second electrodes 120, 130. A height of the grooves 113 can be equal to a thickness of the first and second electrodes 120, 130, thus the surfaces of the first and second electrodes 120, 130 can be coplanar with the contacting surface. The TEM micro-grid 100 can also include a plurality of first electrodes 120 electrically connected to each other, and a plurality of second electrodes 130 electrically connected to each other as shown in FIG. 5. The first and second electrodes 120, 130 can also be disposed on other portions of the grid 110 rather than the contacting surface, as long as the first and second electrodes 120, 130 can be electrically connected to the carbon nanotube film structure 140 and insulated from the grid 110. For example, the first and second electrodes 120, 130 can be placed on a surface of the grid 110 opposite to the contacting surface as shown in FIG. 6 and electrically connected to the carbon nanotube film structure 140 by a conductive wire (not shown), or disposed on a surface of the carbon nanotube film structure 140 opposite to the contacting surface as shown in FIG. 7.

The carbon nanotube film structure 140 includes a plurality of carbon nanotubes uniformly distributed therein, and joined by van der Waals attractive force therebetween. The carbon nanotubes in the carbon nanotube film structure 140 can be orderly or disorderly arranged. The term 'disordered carbon nanotube film structure' includes, but is not limited to, a structure where the carbon nanotubes are arranged along many different directions, such that the number of carbon nanotubes arranged along each different direction can be almost the same (e.g. uniformly disordered), and/or entangled with each other. 'Ordered carbon nanotube film structure' includes, but is not limited to, a structure where the carbon nanotubes are arranged in a consistently systematic manner, e.g., the carbon nanotubes are arranged approximately along a same direction and or have two or more sections within each of which the carbon nanotubes are arranged approximately along a same direction (different sections can have different directions). The carbon nanotubes in the carbon nanotube film structure 140 can be single-walled, double-walled, and/or multi-walled carbon nanotubes.

Macroscopically, the carbon nanotube film structure 140 may have a substantially planar structure. The planar carbon nanotube structure can have a thickness of about 0.5 nanometers to about 100 nanometers. The carbon nanotube film structure 140 is a free standing film and covers the at least one micropore 111. In one embodiment, the carbon nanotube film structure 140 is adhered to the grid 110 and suspended over the micropores 111 of the grid 110. The carbon nanotube film structure 140 includes a plurality of carbon nanotubes and defines a plurality of micropores called carbon nanotube micropores having a dimension of about 1 nanometer to about 1 micrometer. The carbon nanotube film structure 140 includes at least one carbon nanotube film, the at least one carbon nanotube film includes a plurality of carbon nanotubes substantially parallel to a surface of the corresponding carbon nanotube film. A heat capacity per unit area of the carbon nanotube film structure 140 can be less than or can be equal to $2.4 \times 10^{-4}$ J/cm$^2$*K.

Figure 8:
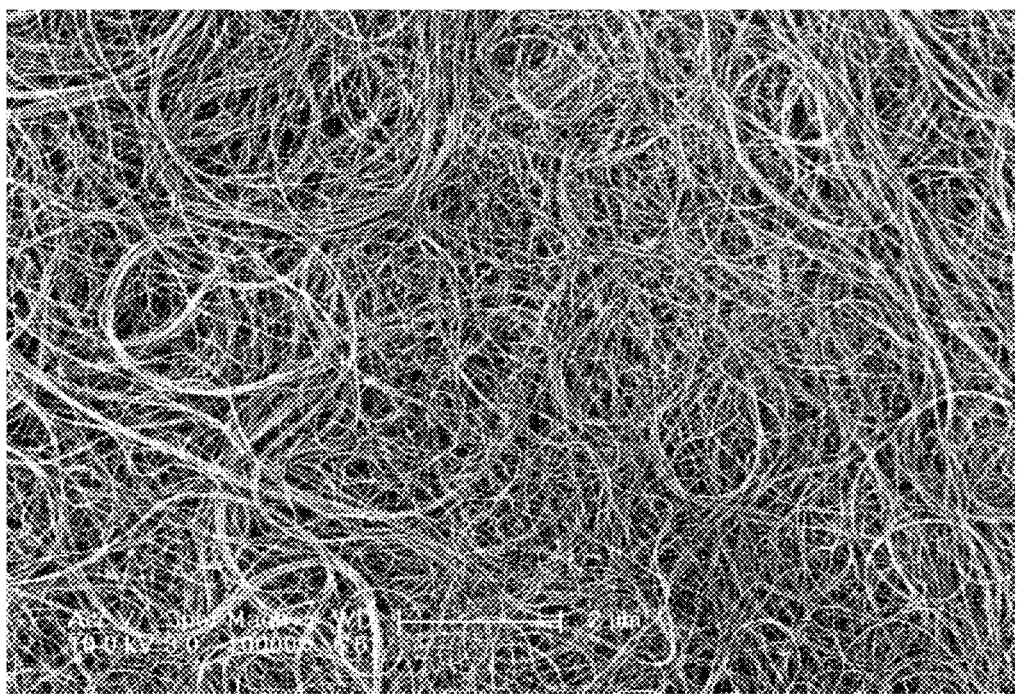
FIG. 8 shows a Scanning Electron Microscope (SEM) image of a flocculated carbon nanotube film.

The carbon nanotube film structure 140 can include a flocculated carbon nanotube film as shown in FIG. 8. The flocculated carbon nanotube film can include a plurality of long, curved, disordered carbon nanotubes entangled with each other. Further, the flocculated carbon nanotube film can be isotropic. The carbon nanotubes can be substantially uniformly dispersed in the carbon nanotube film. The adjacent carbon nanotubes are acted upon by the van der Waals attractive force therebetween, thereby forming an entangled structure with micropores defined therein. Alternatively, the flocculated carbon nanotube film is very porous. Sizes of the micropores can be of about 1 nanometer to about 1 micrometer. Further, due to the carbon nanotubes in the carbon nanotube structure being entangled with each other, the carbon nanotube structure employing the flocculated carbon nanotube film has excellent durability, and can be fashioned into desired shapes with a low risk to the integrity of carbon nanotube structure. The flocculated carbon nanotube film, in some embodiments, will not require the use of structural support due to the carbon nanotubes being entangled and adhered together by van der Waals attractive force therebetween. The flocculated carbon nanotube film can have a thickness of about 0.5 nanometers to about 100 nanometers.

Figure 9:
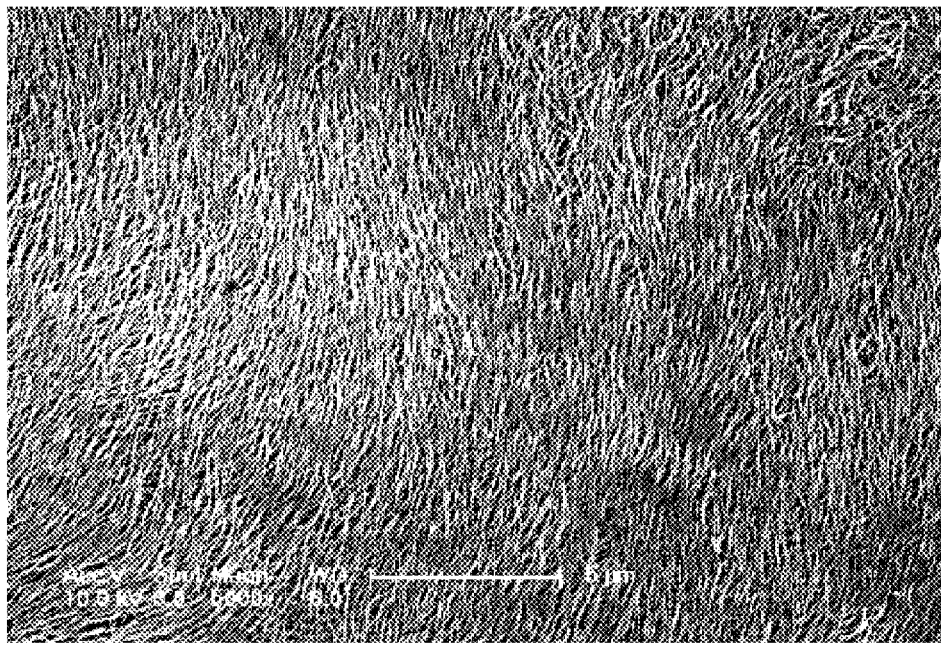
FIG. 9 shows an SEM image of a pressed carbon nanotube film.

The carbon nanotube film structure 140 can include a pressed carbon nanotube film. The carbon nanotubes in the pressed carbon nanotube film can be arranged along a same direction or arranged along different directions. The carbon nanotubes in the pressed carbon nanotube film can rest upon each other. The adjacent carbon nanotubes are combined and attracted to each other by van der Waals attractive force, and can form a free standing structure. An angle between a primary alignment direction of the carbon nanotubes and a surface of the pressed carbon nanotube film can be in an approximate range from 0 degrees to approximately 15 degrees. The pressed carbon nanotube film can be formed by pressing a carbon nanotube array. The angle is closely related to pressure applied to the carbon nanotube array. The greater the pressure, the smaller the angle. The carbon nanotubes in the carbon nanotube film can be substantially parallel to the surface of the carbon nanotube film when the angle is 0 degrees. A length and a width of the carbon nanotube film can be set as desired. The pressed carbon nanotube film can include a plurality of carbon nanotubes substantially aligned along one or more directions. The pressed carbon nanotube film can be obtained by pressing the carbon nanotube array with a pressure head. Alternatively, the shape of the pressure head and the pressing direction can determine the direction of the carbon nanotubes arranged therein. Specifically, in one embodiment, when a planar pressure head is used to press the carbon nanotube array along the direction perpendicular to a substrate. A plurality of carbon nanotubes pressed by the planar pressure head may be sloped in many directions. In another embodiment, as shown in FIG. 9, when a roller-shaped pressure head is used to press the carbon nanotube array along a certain direction, the pressed carbon nanotube film having a plurality of carbon nanotubes substantially aligned along the certain direction can be obtained. In another embodiment, when the roller-shaped pressure head is used to press the carbon nanotube array along different directions, the pressed carbon nanotube film having a plurality of carbon nanotubes substantially aligned along different directions can be obtained. The pressed carbon nanotube film can have a thickness of about 0.5 nanometers to about 100 nanometers, and can define a plurality of micropores having a dimension of about 1 nanometer to about 1 micrometer.

Figure 10:
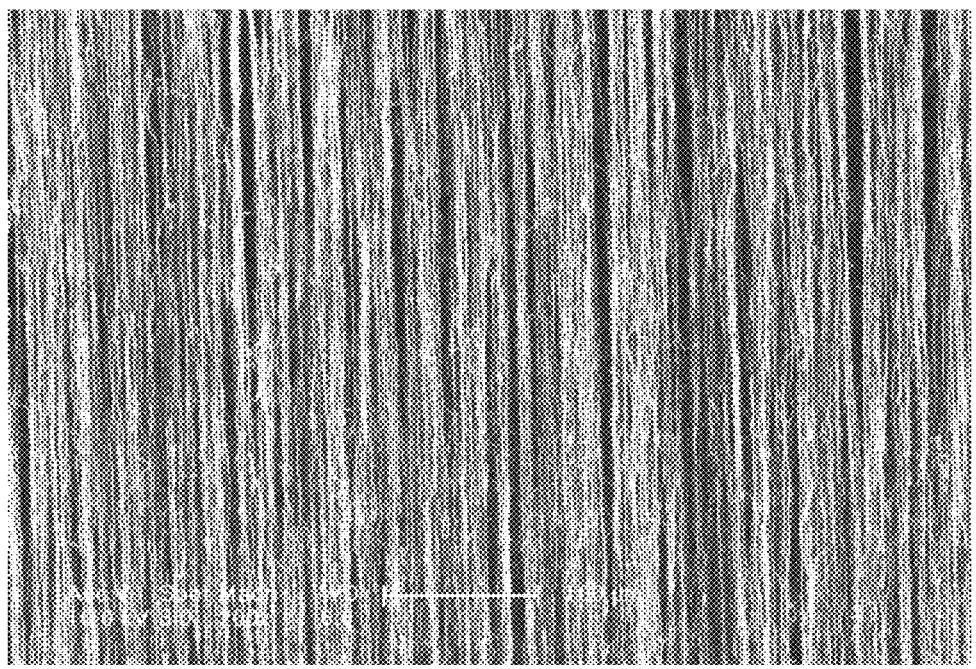
FIG. 10 shows an SEM image of a drawn carbon nanotube film.
Figure 11:
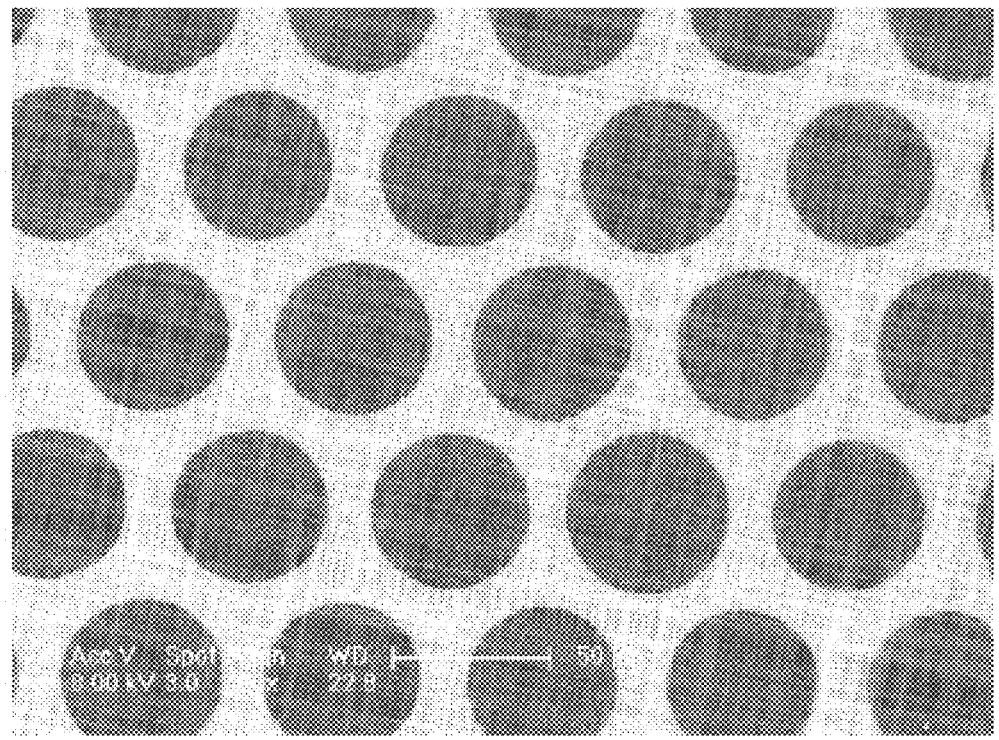
FIG. 11 shows an SEM image of the TEM micro-grid.
Figure 12:
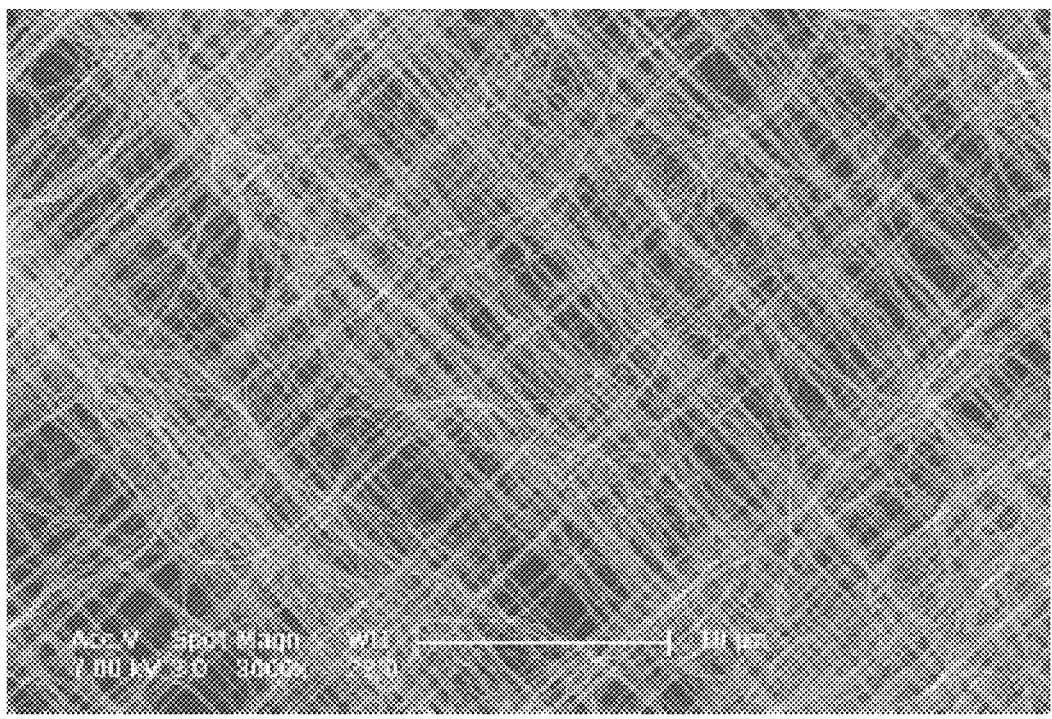
FIG. 12 shows an SEM image of a carbon nanotube film structure of the TEM micro-grid.
Figure 13:
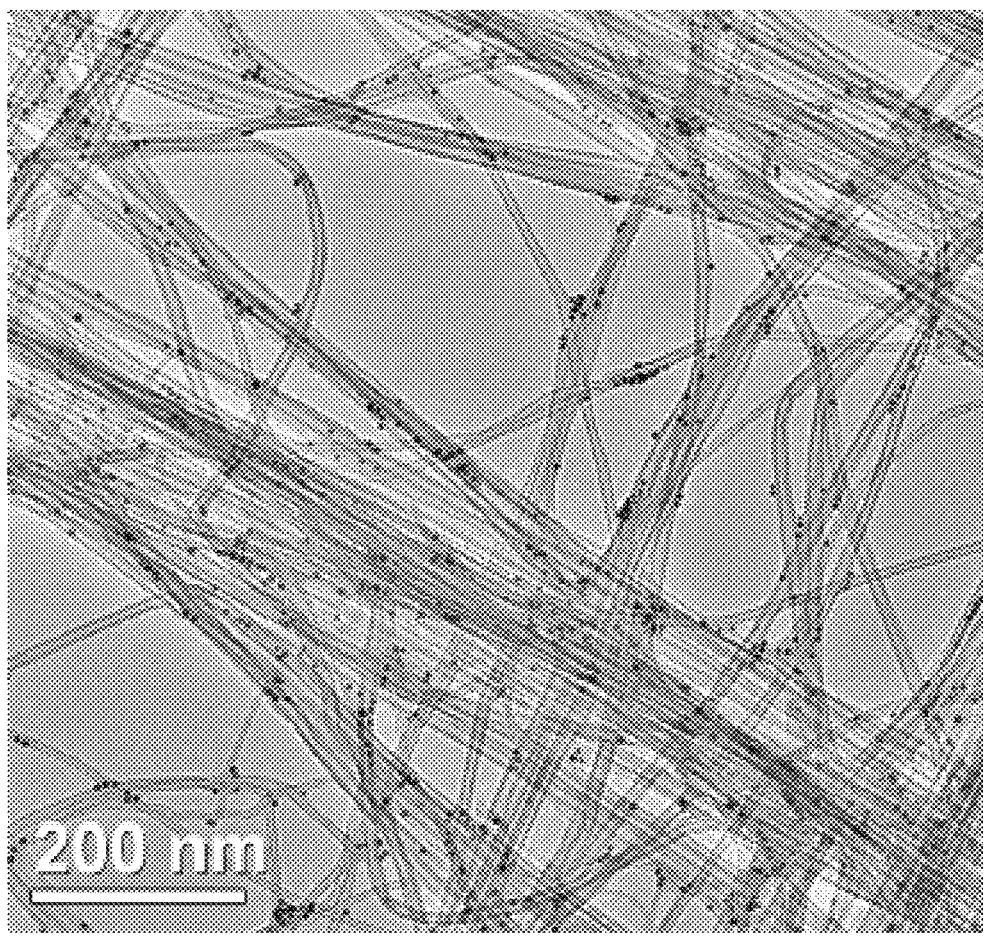
FIG. 13 is a magnified SEM image of the carbon nanotube film structure.

In some embodiments, the carbon nanotube film structure 140 includes at least one drawn carbon nanotube film as shown in FIG. 10. The drawn carbon nanotube film can have a thickness of about 0.5 nanometers to about 100 nanometers. The drawn carbon nanotube film includes a plurality of carbon nanotubes that can be arranged substantially parallel to a surface of the drawn carbon nanotube film. A plurality of micropores having a dimension of about 1 nanometer to about 1 micrometer can be defined by the carbon nanotubes. A large number of the carbon nanotubes in the drawn carbon nanotube film can be oriented along a preferred orientation, meaning that a large number of the carbon nanotubes in the drawn carbon nanotube film are arranged substantially along the same direction. An end of one carbon nanotube is joined to another end of an adjacent carbon nanotube arranged substantially along the same direction, by van der Waals attractive force. More specifically, the drawn carbon nanotube film includes a plurality of successively oriented carbon nanotube segments joined end-to-end by van der Waals attractive force therebetween. Each carbon nanotube segment includes a plurality of carbon nanotubes substantially parallel to each other, and joined by van der Waals attractive force therebetween. The carbon nanotube segments can vary in width, thickness, uniformity and shape. A small number of the carbon nanotubes are randomly arranged in the drawn carbon nanotube film, and has a small if not negligible effect on the larger number of the carbon nanotubes in the drawn carbon nanotube film arranged substantially along the same direction. The carbon nanotube film is capable of forming a free standing structure. The term "free standing structure" can be defined as a structure that does not have to be supported by a substrate. For example, a free standing structure can sustain the weight of itself when it is hoisted by a portion thereof without any significant damage to its structural integrity. The free standing structure of the drawn carbon nanotube film is partially realized by the successive segments joined end to end by van der Waals attractive force.

Understandably, some variation can occur in the orientation of the carbon nanotubes in the drawn carbon nanotube film as can be seen in FIG. 10. Microscopically, the carbon nanotubes oriented substantially along the same direction may not be perfectly aligned in a straight line, and some curve portions may exist. Furthermore, it can be understood that some carbon nanotubes located substantially side by side and oriented along the same direction and in our contact with each other.

In one embodiment, the carbon nanotube film structure 140 includes a plurality of stacked drawn carbon nanotube films. The number of the layers of the drawn carbon nanotube films is not limited, provided the thickness of the carbon nanotube film structure 140 can be maintained in a range from about 0.5 nanometers to about 100 nanometers. Adjacent drawn carbon nanotube films can be adhered by only the van der Waals attractive force therebetween. An angle can exist between the carbon nanotubes in adjacent drawn carbon nanotube films. The angle between the aligned directions of the carbon nanotubes in the adjacent drawn carbon nanotube films can range from 0 degrees to about 90 degrees. In one embodiment, the angle between the aligned directions of the carbon nanotubes in the adjacent carbon nanotube films is about 90 degrees.

Referring to FIG. 10 to FIG. 13, in one embodiment, the carbon nanotube film structure 140 of the TEM micro-grid 100 consists of 4 layers of stacked drawn carbon nanotube films. The angle between the aligned directions of adjacent drawn carbon nanotube films is about 90 degrees, thus a plurality substantially uniform micropores is defined by the carbon nanotube film structure 140.

Figure 14:
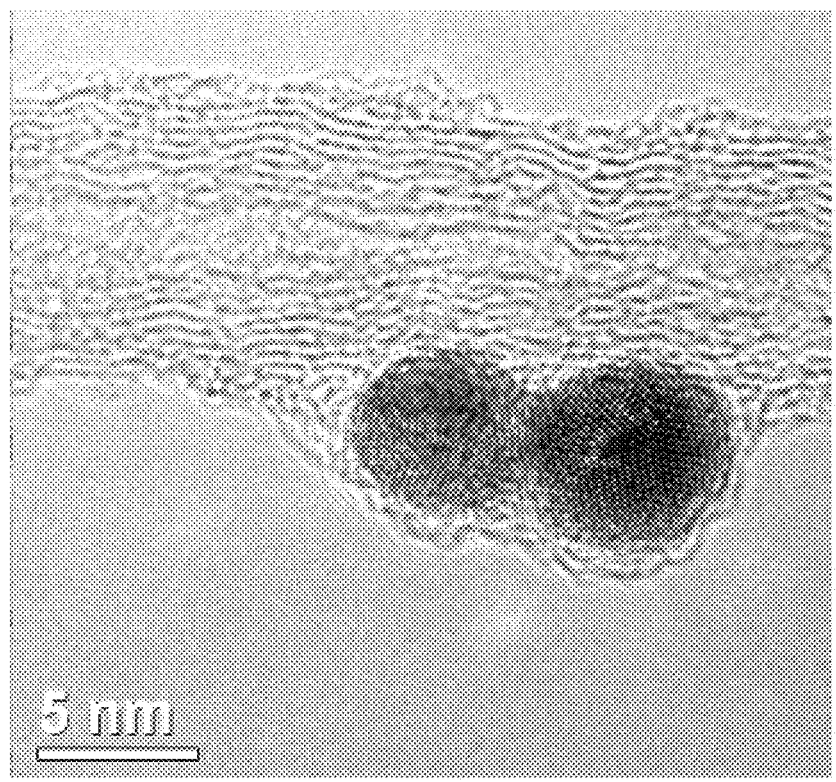
FIG. 14 shows an SEM image of gold nano-particles observed by a TEM adopting the TEM micro-grid.

When the TEM micro-grid 100 is in operation, a sample can be arranged on the carbon nanotube film structure 140. The sample can be nano-particles, nano-wires, nano-rods, or other nano-materials. When a diameter or thickness of the sample is relatively greater, such as 2 micrometers, the sample can be supported by the micropores 111 of the carbon nanotube film structure 140 for observation thereof via the TEM. When the diameter of the sample is relatively less, such as 5 nanometers, the sample can be adsorbed stably on the walls of the carbon nanotubes for observation. Referring to FIG. 14, the black particles depict a gold nano-particle under observation. The gold nano-particle is stably adhered on the walls of the carbon nanotubes for observation and high-resolution imaging.

When it is desired to observe reactions of sample at different temperatures with the TEM, voltage can be applied to the first electrode 120 and the second electrode 130 causing heating of the carbon nanotube film structure 140. Due to the carbon nanotube film structure 140 consisting of carbon nanotubes having little heat capacity per unit area and directly contacting the sample, most of the heat generated by the carbon nanotube film structure 140 can be absorbed by the sample. Thus, heat absorbed by the grid 110 and the carbon nanotube film structure 140 can be relatively less. What is more, both of the absolute values of the thermal expansion coefficients of the grid 110 and the carbon nanotube film structure 140 are relatively low, whereby deformation of the carbon nanotube film structure 140 and the grid 110 reduced to a negligible amount. Further, floating of the sample is prevented, thereby increasing the quality of the TEM images.

Finally, it is to be understood that the above-described embodiments are intended to illustrate rather than limit the disclosure. Variations may be made to the embodiments without departing from the spirit of the disclosure as claimed. Elements associated with any of the above embodiments are envisioned to be associated with any other embodiments. The above-described embodiments illustrate the scope of the disclosure but do not restrict the scope of the disclosure.

What is claimed is:

1. A transmission electron microscope (TEM) micro-grid, comprising:
   a grid; and
   a heater comprising at least one carbon nanotube film structure located on the grid.

2. The micro-grid as claimed in claim 1, further comprising an insulation layer located between the grid and the at least one carbon nanotube film structure.

3. The micro-grid as claimed in claim 1, wherein a material of the grid comprises electrically insulating heat-resistant material.

4. The micro-grid as claimed in claim 1, wherein an absolute value of a thermal expansion coefficient of the grid is less than 3.

5. The micro-grid as claimed in claim 1, wherein the grid comprises at least one micropore, and the at least one micropore has a dimension of about 1 micrometer to about 3 millimeters.

6. The micro-grid as claimed in claim 1, wherein the grid comprises a plurality of micropores, and each of the plurality of micropores has a dimension of about 80 micrometers to about 100 micrometers.

7. The micro-grid as claimed in claim 1, wherein the at least one carbon nanotube film structure comprises at least one carbon nanotube film, the at least one carbon nanotube film comprises a plurality of successively oriented carbon nanotube segments, each of the plurality of successively oriented carbon nanotube segments comprises a plurality of carbon nanotubes substantially parallel to each other and substantially parallel to a surface of the at least one carbon nanotube film.

8. The micro-grid as claimed in claim 7, wherein the plurality of carbon nanotubes of the plurality of successively oriented carbon nanotube segments are substantially aligned in a single direction, and the plurality of successively oriented carbon nanotube segments are joined end-to-end by van der Waals attractive force therebetween.

9. The micro-grid as claimed in claim 1, wherein the at least one carbon nanotube film structure comprises a plurality of layers of carbon nanotube films stacked on each other, and adjacent carbon nanotube films are adhered by the van der Waals attractive force therebetween.

10. The micro-grid as claimed in claim 1, wherein a heat capacity per unit area of the at least one carbon nanotube film structure is less than or equal to $2.4 \times 10^{-4}$ J/cm$^2$*K.

11. The micro-grid as claimed in claim 1, wherein the heater further comprises at least two electrodes electrically connected to the at least one carbon nanotube film structure.

12. The micro-grid as claimed in claim 11, wherein the grid is round, and the at least two electrodes are arc shaped.

13. The micro-grid as claimed in claim 11, wherein the at least two electrodes are located between the gird and the carbon nanotube film structure.

14. The micro-grid as claimed in claim 13, wherein the at least two electrodes are embedded into the grid.

15. The micro-grid as claimed in claim 11, wherein the at least two electrodes are disposed on a surface of the carbon nanotube film structure.

16. The micro-grid as claimed in claim 11, wherein the at least two electrodes comprise a plurality of first electrodes electrically connected to each other, and a plurality of second electrodes electrically connected to each other.

* * * * *